(12) United States Patent
Lee et al.

(10) Patent No.: US 9,997,893 B2
(45) Date of Patent: Jun. 12, 2018

(54) SEMICONDUCTOR LASER DIODE AND METHOD OF FABRICATING THE SAME

(71) Applicants: SAMSUNG ELECTRONICS CO., LTD., Suwon-si (KR); KOREA PHOTONICS TECHNOLOGY INSTITUTE, Gwangju (KR)

(72) Inventors: Jaesoong Lee, Suwon-si (KR); Jinwoo Ju, Gwangju (KR); Youngho Song, Gwangju (KR)

(73) Assignees: SAMSUNG ELECTRONICS CO., LTD., Suwon-si (KR); KOREA PHOTONICS TECHNOLOGY INSTITUTE, Gwangju (KR)

( * ) Notice: Subject to any disclaimer, the term of this patent is extended or adjusted under 35 U.S.C. 154(b) by 0 days. days.

(21) Appl. No.: 14/994,283

(22) Filed: Jan. 13, 2016

(65) Prior Publication Data

US 2016/0352076 A1  Dec. 1, 2016

(30) Foreign Application Priority Data

May 29, 2015  (KR) .................. 10-2015-0076550

(51) Int. Cl.
*H01S 5/00* (2006.01)
*H01S 5/343* (2006.01)
(Continued)

(52) U.S. Cl.
CPC ........ *H01S 5/34333* (2013.01); *H01S 5/2081* (2013.01); *H01S 5/2272* (2013.01);
(Continued)

(58) Field of Classification Search
CPC .. H01S 5/34333; H01S 5/2081; H01S 5/2272; H01S 5/3202; H01S 5/0425; H01S 5/0421
See application file for complete search history.

(56) References Cited

U.S. PATENT DOCUMENTS 8,368,179 B2    2/2013  Kaeding et al.
2002/0145150 A1* 10/2002  Okuyama ............... H01L 33/24
                                                        257/91

(Continued)

FOREIGN PATENT DOCUMENTS

JP    2013-173641 A    9/2013
KR    100755610 B1 *   9/2007  ............. H01L 33/20
(Continued)

OTHER PUBLICATIONS

Enya et al., "531nm Green Lasing of InGaN Based Laser Diodes on Semi-Polar {2012} Free-Standing GaN Substrates", Applied Physics Express, The Japan Society of Applied Physics, vol. 2, 2009, 3 pages total.

*Primary Examiner* — Yuanda Zhang
(74) *Attorney, Agent, or Firm* — Sughrue Mion, PLLC

(57) ABSTRACT

Provided are a semiconductor laser diode and a method for fabricating the same. The semiconductor laser diode includes a c-plane substrate, a group III nitride layer disposed on the c-plane substrate, and a first semiconductor layer, an active layer, and a second semiconductor layer disposed on the group III nitride layer in the stated order, wherein each of the first semiconductor layer and the second semiconductor layer is exposed to the outside of the semiconductor laser diode.

5 Claims, 4 Drawing Sheets

(51) Int. Cl.
- *H01S 5/32* (2006.01)
- *H01S 5/227* (2006.01)
- *H01S 5/20* (2006.01)
- *H01S 5/34* (2006.01)
- *H01S 5/042* (2006.01)

(52) U.S. Cl.
CPC .......... *H01S 5/3202* (2013.01); *H01S 5/3428* (2013.01); *H01S 5/0425* (2013.01); *H01S 2304/12* (2013.01)

(56) References Cited

U.S. PATENT DOCUMENTS

| | | | |
|---|---|---|---|
| 2002/0171089 A1* | 11/2002 | Okuyama | H01L 27/156 257/88 |
| 2003/0017633 A1* | 1/2003 | Doi | H01L 21/76262 438/22 |
| 2003/0180977 A1* | 9/2003 | Suzuki | H01L 33/24 438/22 |
| 2004/0048409 A1* | 3/2004 | Biwa | H01L 33/24 438/46 |
| 2007/0252164 A1 | 11/2007 | Zhong et al. | |
| 2008/0267239 A1* | 10/2008 | Hall | B82Y 20/00 372/46.013 |
| 2012/0281727 A1* | 11/2012 | Fang | G02B 6/12004 372/46.01 |

FOREIGN PATENT DOCUMENTS

| | | |
|---|---|---|
| KR | 10-2012-0116670 A | 10/2012 |
| KR | 10-2015-0000138 A | 1/2015 |

\* cited by examiner

SEMICONDUCTOR LASER DIODE AND METHOD OF FABRICATING THE SAME

CROSS-REFERENCE TO RELATED APPLICATION

This application claims priority from Korean Patent Application No. 10-2015-0076550, filed on May 29, 2015 in the Korean Intellectual Property Office, the disclosure of which is incorporated herein by reference in its entirety.

BACKGROUND

1. Field

Exemplary embodiments relate to a semiconductor laser diode and a method for fabricating the same.

2. Description of the Related Art

Generally, semiconductor light emitting diodes are fabricated as chips that include a first semiconductor layer (e.g., an n-type GaN semiconductor layer) on a substrate; a quantum well-structured active layer on the first semiconductor layer; a second semiconductor layer (e.g., a p-type GaN semiconductor layer) on the active layer; a p-type electrode on an upper side of the first semiconductor layer; and an n-type electrode on an upper side of a portion of the second semiconductor layer, which is exposed after the first semiconductor layer and the active layer are partially etched.

Semiconductors based on group III nitrides represented by GaN are generally fabricated as device structures on a c-plane (0001) using a c-plane (0001) substrate (for example, a sapphire substrate). In this case, spontaneous polarization occurs in a c-plane (0001) direction that corresponds to a growth direction. In particular, when an LED having a representative InGaN/GaN quantum well structure is grown on a c-plane (0001), since a quantum-confined Stark effect (QCSE) is caused by piezoelectric fields due to an internal strain, caused by a lattice mismatch and the like, in the quantum well structure, there is a limit in improving the internal quantum efficiency of the LED.

Furthermore, group III nitrides, particularly GaN and alloys thereof (for example, alloys which include InN and/or AlN), are stable in a hexagonal wurtzite crystal structure defined by 2 or 3 equal basal plane axes at an angle of 120° between one another and perpendicular to a c-axis. Due to atomic positions of a group III element and nitrogen, any plane that is perpendicular to the c-axis contains only one type of atoms. Each plane along the c-axis can contain only one type of atom (i.e., group III element or nitrogen). Accordingly, in order to maintain charge neutrality, for example, in a GaN crystal, an N-face that contains only a nitrogen atom and a Ga-face that contains only a Ga atom are respectively located at ends of the GaN crystal. As a result, a group III nitride crystal exhibits polarity along the c-axis. Such spontaneous polarization is a bulk property and depends on the structure and composition of a crystal. Due to these characteristics, most of the GaN-based devices are grown in a direction that is parallel to the polar c-axis. In addition, when a hetero-structure is formed, since stress is generated due to a large difference in a lattice constant between group III nitrides and the same c-axis orientation of the group III nitrides, piezoelectric polarization is caused.

As such, in a general c-plane quantum well structure formed in group III nitride-based optoelectronic and electronic devices, an electrostatic field induced by piezoelectric polarization and spontaneous polarization changes an energy band structure of the quantum well structure, thereby distorting the distribution of electrons and holes. Such spatial separation of electrons and holes due to the electric field is referred to as the quantum-confined Stark effect. The quantum-confined Stark effect deteriorates the internal quantum efficiency and causes red shift of an emission spectrum and the like.

In addition, when a group III nitride-based material is used to form a semiconductor laser diode, problems such as band bending, non-uniform composition of a high indium-content active layer, reduction in the quantum efficiency of the laser diode at high electric potential density, and the like occur. These problems become more significant when a semiconductor laser diode for generating light with a long wavelength of 500 nm or more is realized. Although a non-polar substrate has been used to try to solve these problems, the non-polar substrate is more expensive than the c-plane substrate and has severe size constraints. Further, although attempts have been made to grow non-polar or semi-polar crystals on an m-plane, a-plane, or r-plane sapphire substrate, these attempts have not sufficiently resolved the above-described problems.

SUMMARY

A (11-22) plane, which is a semi-polar plane of a group III nitride, is formed by selectively growing a group III nitride-based material using a mask pattern ($SiO_2$, $SiN_x$). A stable semiconductor laser diode that is not affected by a wavelength shift at a high current density is formed by using the (11-22) plane via a method for fabricating the semiconductor laser diode.

Additional aspects will be set forth in part in the description which follows and, in part, will be apparent from the description, or may be learned by practice of the presented exemplary embodiments.

According to an aspect of an exemplary embodiment, a semiconductor laser diode includes: a c-plane substrate; a group III nitride layer disposed on the c-plane substrate; and a first semiconductor layer, an active layer and a second semiconductor layer disposed on the group III nitride layer in the stated order, wherein each of the first semiconductor layer and the second semiconductor layer is exposed to the outside of the semiconductor laser diode.

The semiconductor laser diode may further include a first electrode disposed on the first semiconductor layer and a second electrode disposed on the second semiconductor layer.

The first semiconductor layer may include an n-type semiconductor layer, the second semiconductor layer may include a p-type semiconductor layer, the first electrode may include an n-type electrode, and the second electrode may include a p-type electrode.

The first semiconductor layer may include a p-type semiconductor layer, the second semiconductor layer may include an n-type semiconductor layer, the first electrode may include a p-type electrode, and the second electrode may include an n-type electrode.

The semiconductor laser diode may further include a mask pattern disposed on the group III nitride layer, and the first semiconductor layer may be selectively grown.

The mask pattern may include at least one from among a $SiO_2$-based material and a $SiN_x$-based material.

Each of the first semiconductor layer, the active layer and the second semiconductor layer may include a GaN-based material.

According to an aspect of another exemplary embodiment, a semiconductor laser diode includes: a c-plane substrate; a group III nitride layer disposed on the c-plane substrate; first electrodes separated from each other and disposed on the group III nitride layer; and a first semiconductor layer, an active layer, a second semiconductor layer and a second electrode disposed on the group III nitride layer in the stated order.

The first semiconductor layer may include an n-type semiconductor layer, the second semiconductor layer may include a p-type semiconductor layer, the first electrode may include an n-type electrode, and the second electrode may include a p-type electrode.

The first semiconductor layer may include a p-type semiconductor layer, the second semiconductor layer may include an n-type semiconductor layer, the first electrode may include a p-type electrode, and the second electrode may include an n-type electrode.

Each of the first semiconductor layer, the active layer and the second semiconductor layer may include a GaN-based material.

According to an aspect of an exemplary embodiment, a method for fabricating a semiconductor laser diode includes: forming a c-plane substrate; forming a group III nitride layer on the c-plane substrate; forming a mask pattern on the group III nitride layer; forming a first semiconductor layer, an active layer and a second semiconductor layer on the group III nitride layer in the stated order; etching the active layer and the second semiconductor layer of a first plane from among two planes of each structure formed by the first semiconductor layer, the active layer, and the second semiconductor layer; and forming a first electrode on the first semiconductor layer and forming a second electrode on the second semiconductor layer.

The first semiconductor layer may be selectively grown.

The mask pattern may include at least one from among a $SiO_2$-based material and a $SiN_x$-based material.

The first semiconductor layer may include an n-type semiconductor layer, the second semiconductor layer may include a p-type semiconductor layer, the first electrode may include an n-type electrode, and the second electrode may include a p-type electrode.

The first semiconductor layer may include a p-type semiconductor layer, the second semiconductor layer may include an n-type semiconductor layer, the first electrode may include a p-type electrode, and the second electrode may include an n-type electrode.

Each of the first semiconductor layer, the active layer and the second semiconductor layer may include a GaN-based material.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

Figure 1A:
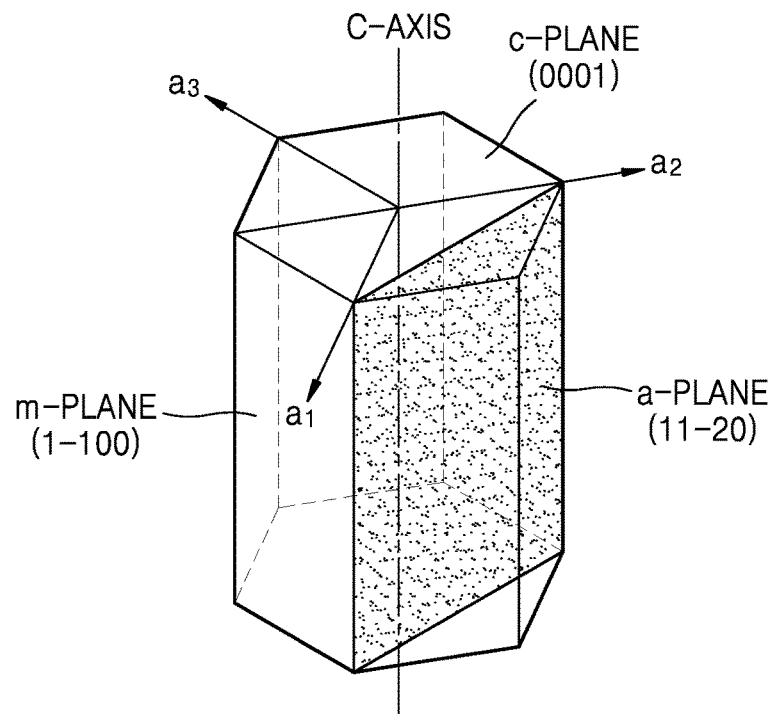
FIG. 1A illustrates non-polar planes (i.e., an a-plane and an m-plane) of a crystal structure of GaN.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the detailed description.

Throughout the specification, when a region is referred to as being "connected" to another region, the region may be "directly connected" to the other region or may be "electrically connected" to the other region via an intervening device. In addition, when a region is referred to as "including" an element, unless otherwise stated, the region may further include other elements.

Figure 1B:
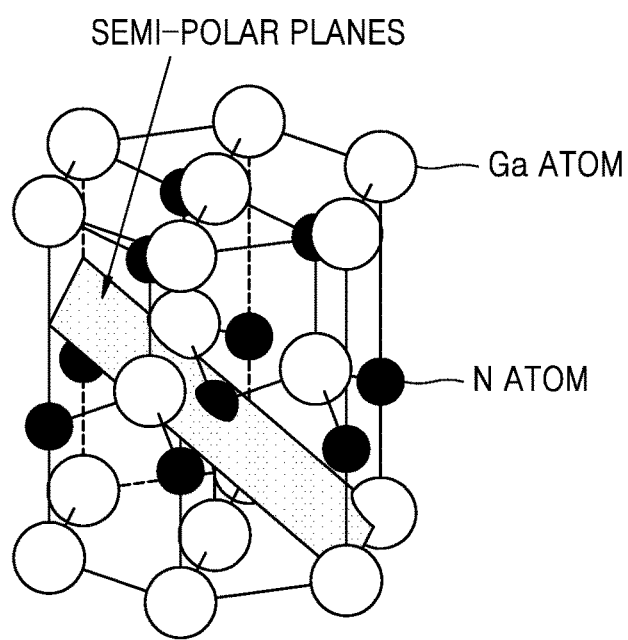
FIG. 1B illustrates a semi-polar plane in a crystal structure of GaN.

FIG. 1A illustrates non-polar planes (i.e., an a-plane and an m-plane) of a crystal structure of GaN, and FIG. 1B illustrates a semi-polar plane in a crystal structure of GaN.

Referring to FIGS. 1A and 1B, the "non-polar plane" is a plane, such as an a-plane or an m-plane, that has a crystal orientation which is perpendicular to a c-axis.

The "semi-polar plane" is a plane that has a crystal orientation between 0° and 90° with respect to a (0001) plane or a (000-1) plane. The "semi-polar plane" extends diagonally across a hexagonal unit cell and forms a non-90° angle with respect to the c-axis. In particular, as compared with the (0001) plane which is a polar plane, since a polar vector is inclined with respect to a growth direction, an influence of polarity on the semi-plane is reduced. Non-limiting examples of the semi-polar plane that are generally observed in group III nitrides may include (11-22), (1-101), (10-11), (10-13), (10-12), (20-21), and (10-14) planes, and the like. The semi-polar plane may be arranged as illustrated in FIG. 1B, and for example, as illustrated in FIG. 1B, a (11-22) semi-polar GaN plane is inclined at about 58° with respect to the (0001) plane.

Figure 2:
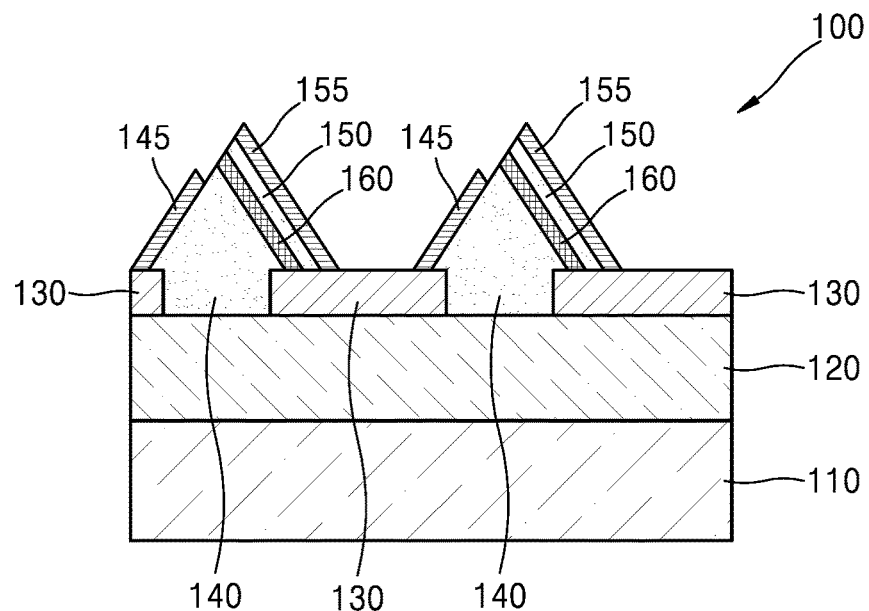
FIG. 2 is a sectional view that schematically illustrates a structure of a semiconductor laser diode, according to an exemplary embodiment.

FIG. 2 is a sectional view that schematically illustrates a structure of a semiconductor laser diode 100, according to an exemplary embodiment.

Referring to FIG. 2, the semiconductor laser diode 100 may include a c-plane substrate 110, a group III nitride layer 120, a mask pattern 130, a first semiconductor layer 140, a first electrode 145, a second semiconductor layer 150, a second electrode 155, and an active layer 160.

The c-plane in the c-plane substrate 110 is a (0001) plane. The c-plane substrate 110 may include at least one from among sapphire, silicon carbide (SiC), lithium aluminate, spinel and the like. According to at least one other exemplary embodiment, the c-plane substrate 110 may further include group III nitrides and alloys thereof (such as, for example, any one or more of gallium nitride (GaN), aluminum nitride (AlN), and the like).

The group III nitride layer 120 may be grown on the c-plane substrate 110. The group III nitride may refer to semiconductor compounds formed from a group III element and nitrogen. Examples of the group III element may include aluminum (Al), gallium (Ga), Indium (In), and the like, which may be used alone or in combination. The group III nitride may include GaN, AlN, InN, AlGaN, AlInN, GaInN, AlInGaN, and the like.

The group III nitride layer 120 may be formed to a thickness of, for example, about 1 μm to about 10 μm, or about 2 μm to about 5 μm. To form the group III nitride layer 120, growth may be performed, for example, at a temperature of about 800° C. to about 1100° C. and at a pressure of about 200 torr to about 500 torr, for a duration of about 60 minutes to about 300 minutes. The above specific growth conditions are examples that are provided for illustrative purposes, and may be modified based on various characteristics, such as, for example, sizes of the substrate and the like.

According to an exemplary embodiment, before the group III nitride layer 120 is grown on the c-plane substrate 110, an intermediate layer or a buffer layer may be formed. The intermediate layer (buffer layer) may be optionally formed in order to obtain better properties of the group III nitride layer 120. The intermediate layer may include other materials which are suitable for promoting growth of the non-polar, particularly semi-polar group III nitride layer 120 as well as III-V compounds, such as AlN, AlGaN, and the like. As such, when the group III nitride layer 120 is grown on the intermediate layer, high-density nuclei can be generated due to reduction in an interfacial energy, as compared with the case of growing the group III nitride layer directly on a heterogeneous substrate. In addition, since plane growth is expedited due to promotion of lateral growth, lattice mismatch can be somewhat mitigated. Deposition or epitaxial growth techniques, such as metal-organic chemical vapor deposition (MOCVD), hydride vapor phase epitaxy (HVPE) and the like, can be utilized to grow the group III nitride layer.

The optionally introduced intermediate layer may have a thickness of at least about 10 nm to about 50 nm, without being limited thereto. In addition, to form the intermediate layer, process conditions may be adjusted to the atmospheric pressure and a temperature of about 550° C. to about 750° C. However, it should be understood that the above process conditions are just an example and are not limited to the above numerical range.

The mask pattern 130 may be formed on the group III nitride layer 120. The mask pattern may include an insulating material and at least one from among $SiO_2$, $SiN_x$ (for example, $Si_3N_4$), and the like. The mask pattern 130 may be formed in a <11-20> direction. A process of forming the mask pattern 130 will be described in detail below.

The first semiconductor layer 140, the active layer 160, and the second semiconductor layer 150 may be formed on the group III nitride layer 120 in the stated order. The first semiconductor layer 140 may be grown on the group III nitride layer 120 by a lateral growth or overgrowth method. Due to the presence of the mask pattern 130, the first semiconductor layer 140 can be selectively grown on at least one predetermined portion of the group III nitride layer 120. The first semiconductor layer 140, which is selectively grown, can form a (11-22) plane, which is a semi-polar plane. After the first semiconductor layer 140 is formed, the active layer 160 and the second semiconductor layer 150 may be grown on the first semiconductor layer 140 in the stated order. After the active layer 160 and the second semiconductor layer 150 are grown, the active layer 160 and the second semiconductor layer 150 that are disposed on one plane out of two semi-polar planes of each structure formed by the first semiconductor layer 140 may be etched. According to the etching process described above, a structure in which both the first semiconductor layer 140 and the second semiconductor layer 150 are exposed to the outside of the semiconductor laser diode 100 can be obtained. in particular, both the first semiconductor layer 140 and the second semiconductor layer 150 may be in direct contact with the outside atmosphere after etching.

Materials for forming the first semiconductor layer 140 and the second semiconductor layer 150 are not particularly limited and may include any of various semiconductor materials (III-V, II-VI and the like) known in the art, such as, for example, GaN, InN, AlN, InP, InS, GaAs, CdS, CdSe, CdTe, ZnS, ZnSe, ZnTe, Zno, $Al_xGa_{1-x}N$, $In_xGa_{1-x}N$, $In_xGa_{1-x}As$, $Zn_xCd_{1-x}S$ ($0<x<1$) and the like. These materials may be used alone or in combination. In addition, the first semiconductor layer 140 and the second semiconductor layer 150 may be of different types. However, a group III nitride may be used for both the first and second semiconductor layers in order to effectively realize homoepitaxy properties.

The active layer 160 may include at least two materials selected from among, for example, GaN, AlN, InN, InGaN, AlGaN, InAlGaN, and the like. Among these materials, a material having a small energy bandgap may become a quantum well and a material having a large energy bandgap may become a quantum barrier, and both single and multiple quantum well structures may be realized.

The first semiconductor layer 140 may be of an n-type and the second semiconductor layer 150 may be of a p-type, and thus have opposite conductive properties. When the first semiconductor layer 140 is an n-type semiconductor layer, the second semiconductor layer 150 may be a p-type semiconductor layer, and when the first semiconductor layer 140 is a p-type semiconductor layer, the second semiconductor layer 150 may be an n-type semiconductor layer.

The first electrode 145 may be formed on the first semiconductor layer 140, and then exposed to the outside of the of the semiconductor laser diode 100 by etching. The second electrode 155 may be formed on the second semiconductor layer 150. Each of the electrodes 145, 155 may include, for example, any of platinum (Pt), palladium (Pd), aluminum (Al), gold (Au), nickel/gold (Ni/Au), and the like. These materials may be used alone or in combination.

When the first semiconductor layer 140 is an n-type semiconductor layer and the second semiconductor layer 150 is a p-type semiconductor layer, the first electrode 145 may be an n-type electrode and the second electrode 155 may be a p-type electrode, and when the first semiconductor layer 140 is a p-type semiconductor layer and the second semiconductor layer 150 is an n-type semiconductor layer, the first electrode 145 may be a p-type electrode and the second electrode 155 may be an n-type electrode.

Figure 3:
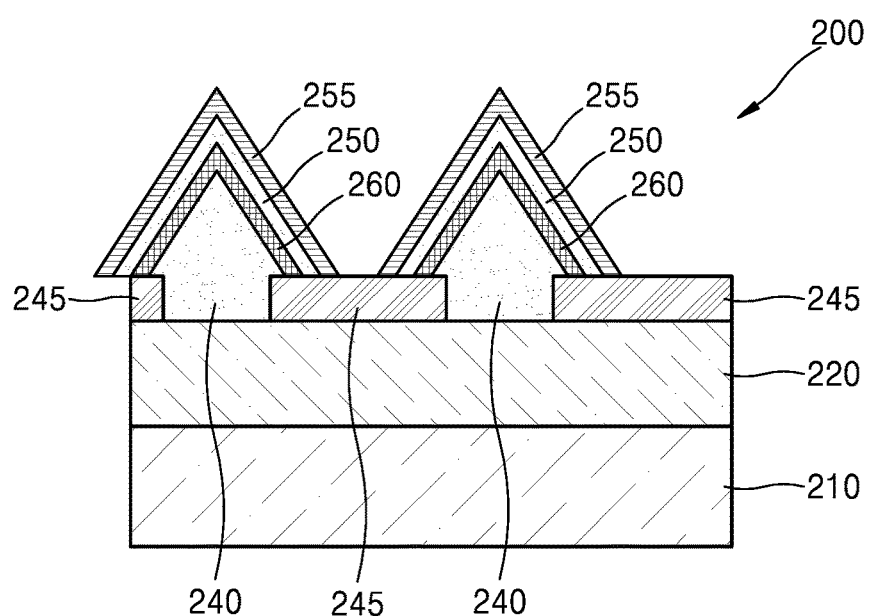
FIG. 3 is a sectional view that schematically illustrates a structure of a semiconductor laser diode, according to an exemplary embodiment.

FIG. 3 is a sectional view that schematically illustrates a structure of a semiconductor laser diode, according to another exemplary embodiment. Referring to FIG. 3, a semiconductor laser diode 200 according to the current exemplary embodiment may include a c-plane substrate 210, a group III nitride layer 220, a first semiconductor layer 240, a first electrode 245, a second semiconductor layer 250, a second electrode 255, and an active layer 260. The c-plane substrate 210 and the group III nitride layer 220 may include the same material and be formed by the same method, as described above with reference to FIG. 2.

A mask pattern (not shown) may be formed in a <11-20> direction on the group III nitride layer 220. After the mask pattern is formed, the first semiconductor layer 240, the active layer 260, and the second semiconductor layer 250 may be formed on the group III nitride layer 220 in the stated order. As described above, the first semiconductor layer 240 may be selectively grown on at least one predetermined portion of the group III nitride layer 220, and the first semiconductor layer 240, which is selectively grown, may form a (11-22) plane, which is a semi-polar plane. Then, the active layer 260 and the second semiconductor layer 250 may be grown on the first semiconductor layer 240 in the stated order.

Next, the mask pattern formed on the group III nitride layer 220 may be removed by etching, and the first electrode 245 may be formed at the position where the mask pattern was etched. In addition, the second electrode 255 may be formed on the second semiconductor layer 250.

When the first semiconductor layer 240 is an n-type semiconductor layer and the second semiconductor layer 250 is a p-type semiconductor layer, the first electrode 245 may be an n-type electrode and the second electrode 255 may be a p-type electrode, and when the first semiconductor layer 240 is a p-type semiconductor layer and the second semiconductor layer 250 is an n-type semiconductor layer, the first electrode 245 may be a p-type electrode and the second electrode 255 may be an n-type electrode.

FIGS. 4A, 4B, 4C, and 4D are sectional views which illustrate a process for fabricating the semiconductor laser diode 100, according to an exemplary embodiment.

Figure 4A:
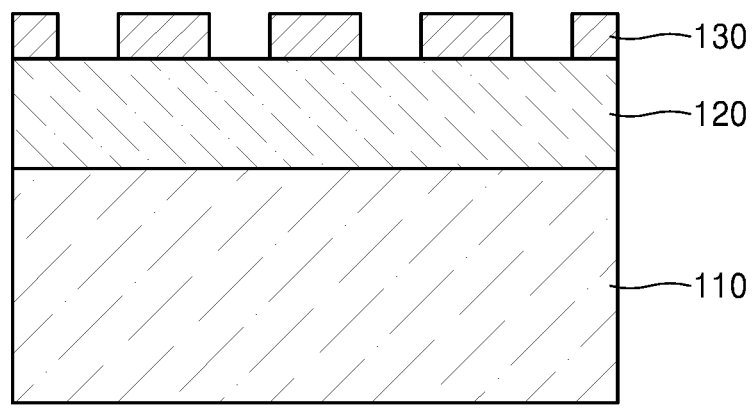
FIGS. 4A, 4B, 4C, and 4D are sectional views that illustrate a process for fabricating a semiconductor laser diode, according to an exemplary embodiment.

Referring to FIG. 4A, a group III nitride layer 120 may be grown on a c-plane substrate 110. The group III nitride layer 120 may be grown by using a general layer growth technique, for example, any of metal organic chemical vapor deposition (MOCVD), hydride vapor phase epitaxy (HVPE), molecular beam epitaxy (MBE), or the like.

A mask pattern 130 may be formed on the group III nitride layer 120. To form the mask pattern 130, a mask layer (not shown) may be formed first, for example, by using plasma enhanced chemical vapor deposition (PECVD). Next, the mask pattern 130 may be formed in a <11-22> direction on the group III nitride layer 120 by using a general photolithography method. A region between the mask patterns 130 may be referred to as a "window region."

According to an exemplary embodiment, the mask pattern 130 may have a width that falls within a range of between about 2 μm and about 50 μm (or about 2 μm to about 10 μm), and the window region may have a width that falls within a range of between about 2 μm and about 20 μm (or between about 2 μm and about 10 μm). In addition, according to an exemplary embodiment, the mask pattern 130 may have a thickness that falls within a range of between about 500 Å and about 2000 Å, without being limited thereto.

Figure 4B:
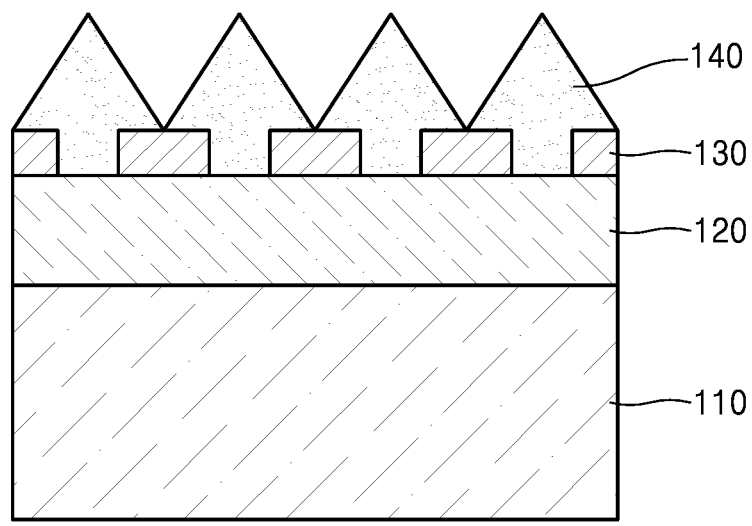

Referring to FIG. 4B, a first semiconductor layer 140 is grown on the group III nitride layer 120. Due to the presence of the mask pattern 130, the first semiconductor layer 140 can be selectively grown on at least one predetermined portion of the group III nitride layer 120. The first semiconductor layer 140, which is selectively grown, can form a (11-22) plane, which is a semi-polar plane.

Figure 4C:
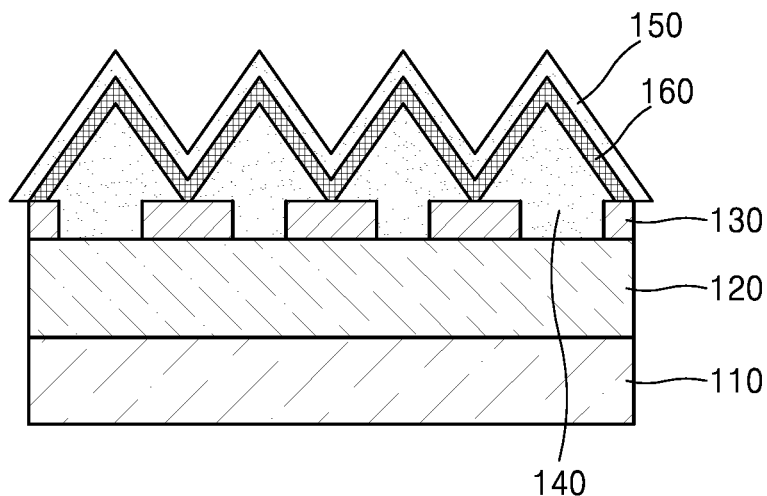

Referring to FIG. 4C, after the first semiconductor layer 140 is formed, an active layer 160 and a second semiconductor layer 150 may be grown on the first semiconductor layer 140 in the stated order. The first semiconductor layer 140, the active layer 160, and the second semiconductor layer 150 form a (11-22) plane, which is a semi-polar layer. In addition, the first semiconductor layer 140, the active layer 160, and the second semiconductor layer 150 may form a plurality of structures. The plurality of structures may have the same shape and a repetitive pattern.

The first semiconductor layer 140 may be of an n-type and the second semiconductor layer 150 may be of a p-type, and as a result, the two semiconductor layers 140 and 150 may have opposite conductive properties. When the first semiconductor layer 140 is an n-type semiconductor layer, the second semiconductor layer 150 may be a p-type semiconductor layer, and when the first semiconductor layer 140 is a p-type semiconductor layer, the second semiconductor layer 150 may be an n-type semiconductor layer.

Figure 4D:
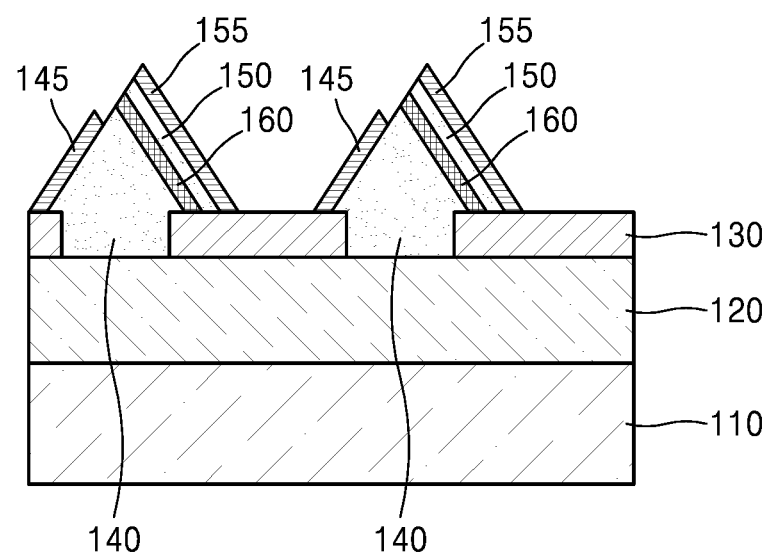

Referring to FIG. 4D, in the plurality of structures described above, the active layer 160 and the second semiconductor layer 150 that are disposed on one plane out of two planes of each of the plurality of structures may be etched. According to the above etching process, a structure in which both the first semiconductor layer 140 and the second semiconductor layer 150 are exposed to the outside of the semiconductor laser diode 100 can be obtained.

A first electrode 145 may be formed on the first semiconductor layer 140, which is exposed to the outside of the semiconductor laser diode 100 by etching. A second electrode 155 may be formed on the second semiconductor layer 150. The first electrode 145 and the second electrode 155 may include, for example, any of platinum (Pt), palladium (Pd), aluminum (Al), gold (Au), nickel/gold (Ni/Au), and the like. These materials may be used alone or in combination.

When the first semiconductor layer 140 is an n-type semiconductor layer and the second semiconductor layer 150 is a p-type semiconductor layer, the first electrode 145 may be an n-type electrode and the second electrode 155 may be a p-type electrode, and when the first semiconductor layer 140 is a p-type semiconductor layer and the second semiconductor layer 150 is an n-type semiconductor layer, the first electrode 145 may be a p-type electrode and the second electrode 155 may be an n-type electrode.

According to the disclosed exemplary embodiments, a high-quality non-polar or semi-polar plane is formed at low cost through patterning and regrowth processes on a c-plane sapphire substrate, so that an internal quantum efficiency of a semiconductor laser diode can be improved by mitigating problems due to growth of a polar nitride. In addition, a stable green laser diode not suffering from a wavelength shift at high current density can be formed.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present inventive concept as defined by the following claims.

What is claimed is:

1. A semiconductor laser diode comprising:
a c-plane substrate;
a group III nitride layer disposed on the c-plane substrate;
a mask pattern disposed on the group III nitride layer, the mask pattern being formed by forming a mask layer by using plasma enhanced chemical vapor deposition (PECVD) and using a photolithography method with respect to the mask layer;
a first semiconductor layer, an active layer, and a second semiconductor layer disposed, in order, on the group III nitride layer, the first semiconductor layer having a pair of faces to face each other, and the active layer and the second semiconductor layer are disposed on a first face of the pair of faces, and a second face of the pair of faces is not covered by the active layer and the second semiconductor layer;

a first electrode disposed on the second face of the first semiconductor layer, such that the first electrode is not disposed on any other face of the first semiconductor layer; and a second electrode disposed on the first face of the first semiconductor layer with the active layer and the second semiconductor layer therebetween, such that the second electrode is not disposed on any other face of the first semiconductor layer, wherein each of the first semiconductor layer and the second semiconductor layer is exposed to an outside of the semiconductor laser diode, wherein the first semiconductor layer is selectively grown on at least one predetermined portion of the group III nitride layer based on the mask pattern, and wherein the first semiconductor layer forms a (11-22) plane which is a semi-polar plane.

2. The semiconductor laser diode according to claim 1, wherein the first semiconductor layer includes an n-type semiconductor layer, the second semiconductor layer includes a p-type semiconductor layer, the first electrode includes an n-type electrode, and the second electrode includes a p-type electrode.

3. The semiconductor laser diode according to claim 1, wherein the first semiconductor layer includes a p-type semiconductor layer, the second semiconductor layer includes an n-type semiconductor layer, the first electrode includes a p-type electrode, and the second electrode includes an n-type electrode.

4. The semiconductor laser diode according to claim 1, wherein the mask pattern comprises at least one from among a $SiO_2$-based material and a $SiN_x$-based material.

5. The semiconductor laser diode according to claim 1, wherein each of the first semiconductor layer, the active layer, and the second semiconductor layer comprises a GaN-based material.

* * * * *